United States Patent
Wenzel et al.

(10) Patent No.: US 6,812,580 B1
(45) Date of Patent: Nov. 2, 2004

(54) SEMICONDUCTOR PACKAGE HAVING OPTIMIZED WIRE BOND POSITIONING

(75) Inventors: Robert J. Wenzel, Austin, TX (US); Peter R. Harper, Round Rock, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/457,632

(22) Filed: Jun. 9, 2003

(51) Int. Cl.⁷ .......................... H01L 23/48; H01L 23/52; H01L 29/40
(52) U.S. Cl. .......................... 257/784; 257/691; 257/786
(58) Field of Search .............................. 257/784, 786, 257/691, 723, 724

(56) References Cited

U.S. PATENT DOCUMENTS

| | | | |
|---|---|---|---|
| 5,468,999 A | 11/1995 | Lin et al. | |
| 6,160,705 A | 12/2000 | Stearns et al. | |
| 6,242,814 B1 | 6/2001 | Bassett | |
| 6,291,898 B1 * | 9/2001 | Yeh et al. | 257/786 |
| 6,476,506 B1 * | 11/2002 | O'Connor et al. | 257/786 |
| 6,489,682 B1 * | 12/2002 | Yeh et al. | 257/738 |
| 6,534,879 B2 * | 3/2003 | Terui | 257/786 |
| 6,538,336 B1 * | 3/2003 | Secker et al. | 257/786 |
| 6,545,367 B2 * | 4/2003 | Sota | 257/786 |
| 6,597,065 B1 * | 7/2003 | Efland | 257/712 |
| 6,707,164 B2 * | 3/2004 | Cheng et al. | 257/786 |
| 6,713,849 B2 * | 3/2004 | Hasebe et al. | 257/667 |
| 6,713,881 B2 * | 3/2004 | Umehara et al. | 257/786 |

* cited by examiner

*Primary Examiner*—S. V. Clark
(74) *Attorney, Agent, or Firm*—Joanna G. Chiu; Robert L. King

(57) ABSTRACT

Closely-spaced bonding wires may be used in a variety of different packaging applications to achieve improved electrical performance. In one embodiment, two adjacent bonding wires within a wire grouping are closely-spaced if a separation distance D between the two adjacent wires is met for at least 50 percent of the length of the shorter of the two adjacent wires. In one embodiment, the separation distance D is at most two times a diameter of the wire having the larger diameter of the two adjacent wires. In another embodiment, the separation distance D is at most three times a wire-to-wire pitch between the two adjacent wires. Each wire grouping may include two of more closely-spaced wires. Wire groupings of closely-spaced bonding wires may be used to form, for example, power-signal-ground triplets, signal-ground pairs, signal-power pairs, or differential signal pairs or triplets.

30 Claims, 5 Drawing Sheets

SEMICONDUCTOR PACKAGE HAVING OPTIMIZED WIRE BOND POSITIONING

FIELD OF THE INVENTION

The present invention relates generally to semiconductor packages, and more specifically, to semiconductor packages having optimized wire bond positioning.

RELATED ART

In semiconductor packaging, wire bonds may be used to provide electrical connections from the semiconductor die to the package substrate. For example, wire bonds may be used to provide electrical connections between bond pads of the semiconductor die to bond posts on the package substrate. However, as semiconductor technologies evolve, the number of electrical connections needed between the semiconductor die and package substrate increases, while the size of semiconductor die and packages continues to decrease. Thus, current wire bonded semiconductor die with one or more rows of pads along a periphery of the die become pad-limited as more connections are required. Once pad-limited, further reductions in die size are not possible without reducing the number of connections. For example, once pad-limited, additional ground and power pads may be sacrificed, which may harm electrical performance. Furthermore, in current wire bonding technologies, the wires are kept as far apart as possible to prevent shorting. This also results in longer wires with increased inductance. Therefore, a need exists for a semiconductor package having improved wire bond positioning which allows for reduced semiconductor die sizes and improved electrical performance.

BRIEF DESCRIPTION OF THE DRAWINGS

The present invention is illustrated by way of example and not limited by the accompanying figures, in which like references indicate similar elements, and in which.

Figure 1:
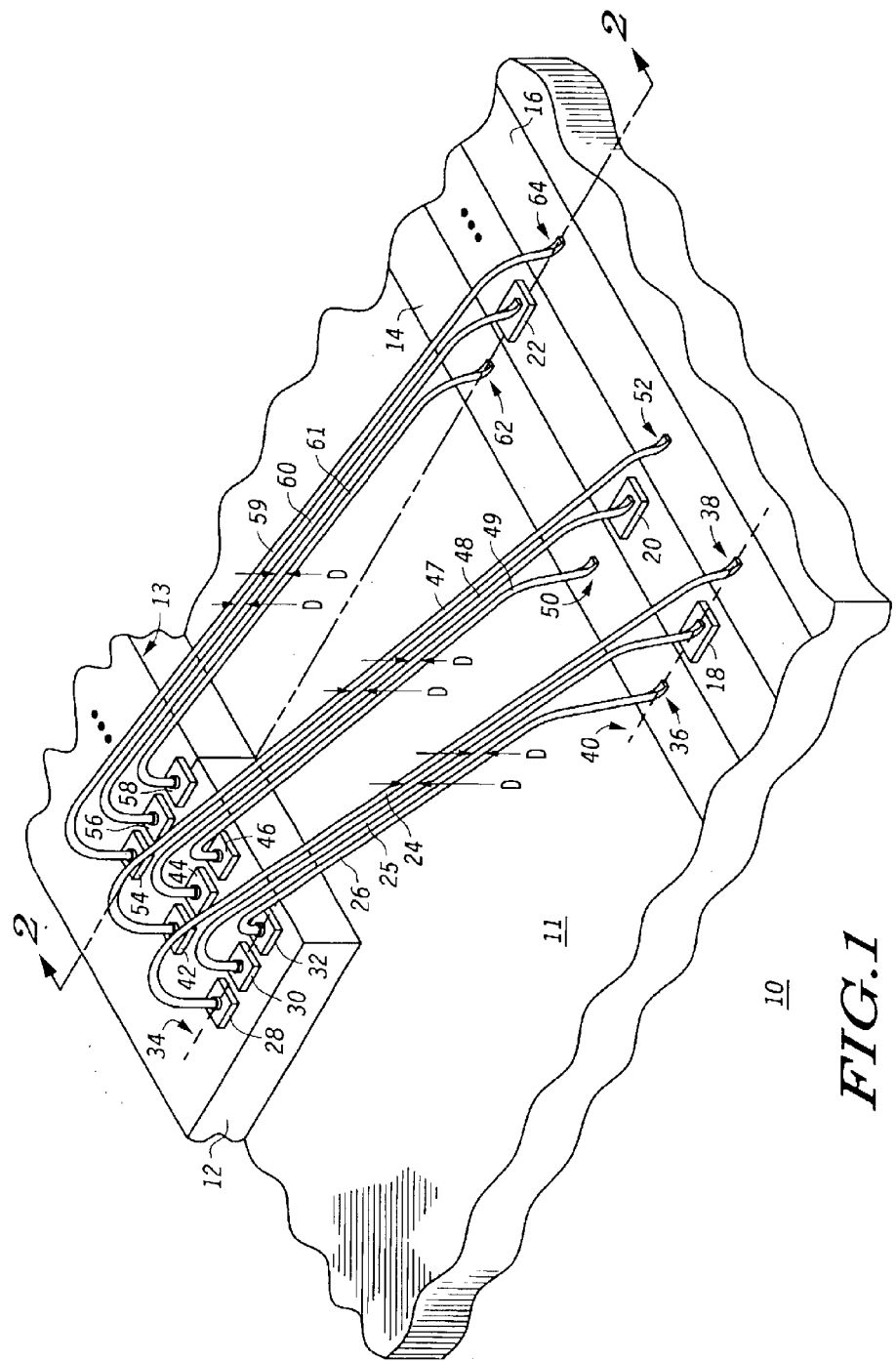
FIG. 1 illustrates a three-dimensional view of a packaged semiconductor device in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiment of the present invention.

DETAILED DESCRIPTION OF THE DRAWINGS

As semiconductor technologies evolve, the size of semiconductor die continues to decrease, thus reducing the amount of space available for bond pads (and thus, electrical connections to the semiconductor die). One embodiment disclosed herein relates to using closely-spaced wires in order to increase the amount of electrical connections possible and in order to improve electrical performance. In one embodiment, closely-spaced wire bonds are bonding wires that are spaced at a separation distance from each other, where the separation distance is no greater than two times a bonding wire diameter for at least 50 percent of the length of the wires (or in some embodiments, at least 70 percent or at least 80 percent of the length of the wires). In some situations, these closely-spaced wires may be used to improve the signal-to-ground ratio (or signal-to-power-ground-pair ratio) which are metrics used to indicate the electrical performance potential of a semiconductor die. That is, the lower the ratio, the better the electrical performance, and the higher the ratio, the worse the electrical performance as taken from a simultaneous switching (ground and power bounce) point of view.

In one embodiment, in order to improve electrical performance, closely-spaced wires may be used in ground-signal-power triplet, in signal-ground pair, in signal-power pair, or in power-ground pair configurations for a portion of or all of the signals of a semiconductor die. Alternatively, closely-spaced wires may also be used for differential signals (e.g. in a pair having a positive signal and a negative signal corresponding to a differential signal or in a triplet having a ground signal as well). The closely-spaced wires within the triplets or pairs provide for a substantially controlled impedance and allow for a reduction in signal-ground, signal-power, or power-ground loop inductance. Furthermore, the cross talk between neighboring signals as well as the simultaneous switching noise associated with a signal bus is also reduced. Also, in one embodiment, the triplets or pairs may include insulated wires such that two or more wires may be touching. Also, in alternate embodiments, wire grouping configurations of more than two or three closely-spaced wires may be used. These embodiments will be further understood in reference to FIGS. 1–8 below.

Closely-spaced wires, as used herein, are wires that are spaced closely together as defined by a separation distance D. That is, two adjacent bonding wires are closely-spaced if a separation distance D is met for at least 50 percent of the length of the shorter of the two adjacent bonding wires. In one embodiment, the separation distance D between two adjacent wires refers to the shortest measured distance between the outer surfaces of the two adjacent wires and is at most two times a diameter of the wire having the larger diameter of the two adjacent bonding wires. (Note that the two adjacent bonding wires may have a same diameter or different diameters.) Therefore, although the distance between two adjacent wires may vary along the length of the wires, they are considered closely-spaced if the separation distance D of at most two times the diameter of the wire having the larger diameter is met for at least 50 percent the length of the shorter wire. Therefore, note that as used herein, unless pointed out otherwise, separation distance D of FIGS. 1–8, corresponds to the same separation distance D described above (i.e. described as being at most two times the diameter of the wire having the larger diameter).

FIG. 1 illustrates a three-dimensional view of a packaged semiconductor device 10 in accordance with one embodiment of the present invention. Packaged semiconductor device 10 includes a semiconductor device 12 overlying a package substrate 11. (Note that package substrate 11 may also be a lead frame or another device.) Also, in the illustrated embodiment, a surface of semiconductor device 12 and a surface of package substrate 11 are positioned within different planes. Packaged semiconductor device 10 also includes a plurality of bonding wires 24–26, 47–49, and 59–61 which provide electrical connections from bonding pads 28, 30, 32, 42, 44, 46, 54, 56, and 58 of semiconductor device 12 to bond posts 18, 20, and 22 and bond locations 36, 38, 50, 52, 62, and 64 of package substrate 11. That is, bonding wires 24, 25, and 26 provide electrical connections from bond pads 28, 30, and 32, to bonding location 38, bond post 18, and bonding location 36, respectively. Bonding wires 47, 48, and 49 provide electrical connections from bond pads 42, 44, and 46, to bonding location 52, bond post 20, and bonding location 50, respectively. Bonding wires 59, 60, and 61 provide electrical connections from bond pads 54, 56, and 58, to bonding location 64, bond post 22, and bonding location 62, respectively.

Note that bond pads 28, 30, 32, 42, 44, 46, 54, 56, and 58, bonding posts 18, 20, and 22, and power buses 14 and 16 may also be referred to as connecting sites or connection pads. Furthermore, each of these connecting sites can be formed of any electrically conductive material, such as gold, copper, aluminum, etc., as known in the art. Also, bonding wires 24–26, 47–49, and 59–61 can be any type of electrically conductive wires, such as gold, copper, aluminum, etc., as known in the art, and in some embodiments, may be insulated wires. Alternatively, less than all wires within a wire grouping may be insulated. For example, in one embodiment, only wire 25 may be insulated while wires 24 and 26 may not be. Bonding wires 24–26, 47–49, and 59–61 can be formed using any type of wire bonding process and equipment, such as, for example, those currently known in the art today. Also, as used herein, a wire grouping corresponds to a group of two or more closely-spaced wires, such as, for example, wires 24–26 or wires 47–49 or wires 59–61. Note that as mentioned above, each wire grouping may include two or more wires, and is not limited to only two or three wires.

Package substrate 11 also includes a power bus 14 and a power bus 16, where power bus 14 includes bonding locations 36, 50, and 62 and power bus 16 includes bonding locations 38, 52, and 64. In one embodiment, power bus 14 is a ground bus and power bus 16 is a Vdd power bus. However, in alternate embodiments, power bus 14 is the Vdd power bus and power bus 16 is the ground bus. Alternatively, bond locations 36, 50, 62, 38, 52, and 64 may be separate bond posts (such as bond posts 18, 20, and 22) rather than bond locations on a bus structure. Also, note that in one embodiment, each of power bus 14 and power bus 16 are ring structures which surround device 12 or, alternatively, are segmented ring structures. In the illustrated embodiment, each group of connecting locations on package substrate 11 are spaced apart in a fan-out configuration. That is, the group of bonding locations 62 and 64 and bond post 22 may be spaced apart from the group of bonding locations 50 and 52 and bond post 20 at a distance different from the distance between the group of bonding locations 50 and 52 and bond post 20 and the group of bonding locations 36 and 38 and bond post 18. Alternatively, the groups of connecting locations may be spaced apart evenly.

Semiconductor device 12 may be any type of semiconductor device or die. For example, in one embodiment semiconductor device 12 may include any type of circuitry to implement any desired functionality. Alternatively, semiconductor die 12 may be a single active or passive element. Alternatively, semiconductor die 12 may be a passive or active element made of any non-semiconducting material such as, for example, metal or ceramic. Also, semiconductor package substrate 11 can be any type of semiconductor package made in a variety of different ways using a variety of different materials, as known in the art. For example, in one embodiment, as will be described in reference to FIG. 2, package substrate 11 may be a ball grid array (BGA) or land grid array (LGA) package substrate.

In the illustrated embodiment, bonding wire 24 and bonding wire 25 are spaced apart by a separation distance D for at least 50 percent the length of the shorter of bonding wires 24 and 25. As described above, in one embodiment, separation distance D is at most two times the diameter of the larger of bonding wire 24 and bonding wire 25. That is, in one embodiment, bonding wire 24 and bonding wire 25 may have different substantially predetermined diameters, and in that case, the separation distance D between wires 24 and 25 (corresponding to the shortest measured distance between the outer edges of wires 24 and 25) would be at most two times the diameter of the larger one. Also, note that separation distance D may vary along the length of the wire, but is at most two times the larger diameter along at least 50 percent the length of the shortest wire (bonding wire 25 in this example). Also, note that bonding wires 25 and 26 maintain a separation distance D (which, in one embodiment, is also defined as being at most two times the diameter of the larger of bonding wire 25 and bonding wire 26) along at least 50 percent the length of the shortest of bonding wire 25 and bonding wire 26. Note that in an embodiment where one or both of bonding wires 24 and 25 are insulated, the separation distance D may be zero, such that bonding wires 24 and 25 may be touching.

Alternatively, note that the separation distance D between two adjacent bonding wires may be defined as a separation pitch (i.e. a wire-to-wire pitch) that is at most three times the diameter of the larger wire. In this embodiment, if it is assumed that bonding wire 25 is larger in diameter than bonding wire 24, then the separation pitch between bonding wires 24 and 25 (defined as the distance between the center of wire 24 and the center of wire 25) is at most three times the diameter of bonding wire 25 for at least 50 percent the length of bonding wire 25.

Note that bonding wires 24 and 25 are being used as examples, however, the same descriptions provided in this paragraph for bonding wires 24 and 25 also apply to bonding wires 25 and 26, bonding wires 47 and 48, bonding wires 48 and 49. That is, the same description applies generally to any two adjacent wires (or closely spaced wires) within a same wire grouping.

In the illustrated embodiment, bonding pads 28, 30, and 32 are positioned such that they are in line with a line or axis (indicated by dotted line 34) that is substantially orthogonal to a peripheral edge 13 of semiconductor device 12. Similarly, note that in the illustrated embodiment, bonding locations 36 and 38 and bond post 18 are positioned such that they are in line with a line (indicated by dotted line 40) that is also perpendicular to a line defined by the same edge 13 of semiconductor device 12. As will be discussed further below, though, note that in alternate embodiments, bonding pads 28, 30, 32 may not be collinear with each other and may not be perpendicular to edge 13 of semiconductor device 12. Similarly, in alternate embodiments, bonding locations 36 and 38 and bond posts 18 may not be collinear with each other and may not be perpendicular to a line defined by edge 13 of semiconductor device 12. For example, in one embodiment, the bonding pads at a corner of semiconductor device 12 (or at any other location of semiconductor device 12) may be staggered. However, in various embodiments, regardless of how the bonding pads, bonding posts, or bonding locations are positioned in these embodiments, the separation distance D is maintained between two adjacent wires within a wire grouping for at least 50 percent the length of the shorter of the two adjacent wires. Also note that in the illustrated embodiment, each of the group of bonding pads 28, 30, and 32, the group of bonding pads 42, 44, and 46, and the group of bonding pads 54, 56, and 58 are spaced evenly apart from each other such that a space between the group of bonding pads 28, 30, and 32 and the group of bonding pads 42, 44, and 46 is the same as the space between the group of bonding pads 42, 44, and 46 and the group of bonding pads 54, 56, and 58. Alternatively, though, they may not be evenly spaced such that the spacing between adjacent groups of bonding pads is different.

In the illustrated embodiment of FIG. 1, each of the bonding wires within a wire grouping (such as bonding wires 24–26) are in line with each other for all or at least a majority of the length of the wires. That is, at least 50 percent of bonding wire 26 is directly below (separated by separation distance D) and in line with bonding wire 25, and at least 50 percent of bonding wire 25 is directly below (separated by separation distance D) and in line with bonding wire 24, such that when viewed from a top-down view (as will be discussed in reference to FIG. 3), a single line is seen along a majority of the length of the wires. In one embodiment, as illustrated in FIG. 1, much of the bonding wires are in line with each other, or at least at a separation distance D from each other, for as long of the wire length as possible.

In one embodiment of the present invention, each of the wire groupings of FIG. 1 may correspond to a power-signal-ground grouping. For example, using the wire grouping including bonding wires 24–26 as an example, bond pad 30 may correspond to a signal of semiconductor device 12 that is routed to or from bond post 18 via bonding wire 25, while bond pad 28 may correspond to a VDD power connection for semiconductor device 12 that is routed from power bus 16 via bonding wire 24, and bond pad 32 may correspond to a ground connection for semiconductor device 12 that is routed from power bus 14 via bonding wire 26. That is, bond pad 30 may be a signal bus for conducting a signal, bond pad 28 may be a power bus for conducting a Vdd power supply voltage, and bond pad 32 may be a power bus for conducting a ground reference voltage. (Alternatively, bond pad 32, bonding wire 26, and power bus 14 may correspond to the VDD power connection and bond pad 28, bonding wire 24, and power bus 16 may correspond to the ground connection.) In these embodiments, by having the signal bonding wire in between a corresponding Vdd power bonding wire and ground bonding wire, electrical performance can be improved by substantially controlling impedance which allows for a reduction in signal ground and signal-power loop inductance. Furthermore, in this manner, cross talk noise may also be reduced.

In yet another embodiment, though, bond pad 32 may correspond to a signal of semiconductor device 12 that is routed to or from a bonding location (which may be a bonding post such as bonding post 18 but located at bonding location 36, not shown in FIG. 1) via bonding wire 26, while one of bond pads 28 or 30 corresponds to a VDD power connection, and the other to a ground connection. In yet another embodiment, bond pad 28 may correspond to a signal of semiconductor device 12 that is routed to or from a bonding location (which may be a bonding post such as bonding post 18 but located at bonding location 38, not shown in FIG. 1) via bonding wire 24, while one of bond pads 30 or 32 corresponds to a VDD power connection, and the other to a ground connection. Therefore, in one embodiment, each bond pad corresponding to a signal of semiconductor device 12 may have a corresponding VDD power and ground connection, where all are routed to package substrate 11 via closely-spaced bonding wires in order to improve electrical performance by substantially controlling impedance which allows for a reduction in signal-ground and signal-power loop inductance. In an alternate embodiment, though, only a portion of the bonding pads corresponding to signals of semiconductor device 12 may be within a wire grouping.

Note also that just as signal, VDD power, and ground connections can be provided in any order within a wire grouping, the connections on the package substrate may also be provided in any order. For example, bonding location 36, bond post 18, and bonding location 38 may be in same order as bonding pads 28, 30, 32, such that bonding wire 24 connects bond pad 32 to bonding location 36, bonding wire 25 connects bond pad 30 to bond post 18, and bonding wire 26 connects bond pad 28 to bonding location 38. However, in alternate embodiments, the bonding locations and bond posts on package substrate 11 can be provided in a different order such that bonding wires may cross over each other, or may be bent accordingly to achieve the proper connection. For example, the bonding wires within a wire grouping may be twisted together, bent, curved, or shaped in any manner so long as for at least 50 percent of the shortest of the wires within the wire grouping, any two adjacent wires are separated by no more than separation distance D. Note that in the case where the wires cross or are twisted, the wires which are adjacent each other may change along the length of the wires. Furthermore, one or more of the wires may be insulated so that they may touch (and therefore have a separation distance of 0) along a majority or almost all of the length of the wires.

Note that in an alternate embodiment, some or all of the wire grouping of FIG. 1 may be wire groupings of two wires. In this embodiment, only two of bond pads 28, 30, and 32 are needed, and only two of bonding locations 36 and 38 and bond post 18 are needed. However, the same descriptions provided above in reference to a wire grouping of three generally apply to a wire grouping of two. That is, of the two bond pads, one may be a connection for a signal of semiconductor device 12 and the other may be one of a Vdd power or a ground connection. Furthermore, they may be located in any order with respect to edge 13 of semiconductor device 12. (For example, the signal bond pad, VDD power bond pad, or ground bond pad can be closest to edge 13.) Also, the bonding locations and bond posts, as needed, on package substrate 11 may be located in any order where the two wires within the wire grouping may cross or be curved or twisted. Also, one or more of the wires may be insulated.

In yet an alternate embodiment, a wire grouping may have three wires where two correspond to a differential signal pair and one to a ground connection, or may have only two wires corresponding to a differential signal pair without a local in-group ground wire. The same descriptions provided above for the groupings of power-signal-ground groupings or power-ground-signal groupings also apply for these type of triplet and pair groupings for differential signals. Also, alternate embodiments may include more than three wires within a wire grouping where the bond pads, bonding locations, bond posts, as needed, may be positioned in any order on the device and the package substrate, as needed, and where any two adjacent wires within the wire grouping are spaced apart by separation distance D along at least 50 percent of the shorter of the two adjacent wires.

In the illustrated embodiment of FIG. 1, note that each bonding wire is within a wire grouping of closely-spaced wires. However, note that in alternate embodiments, only a portion of the bonding wires for semiconductor device 12 may be within a wire grouping.

Figure 2:
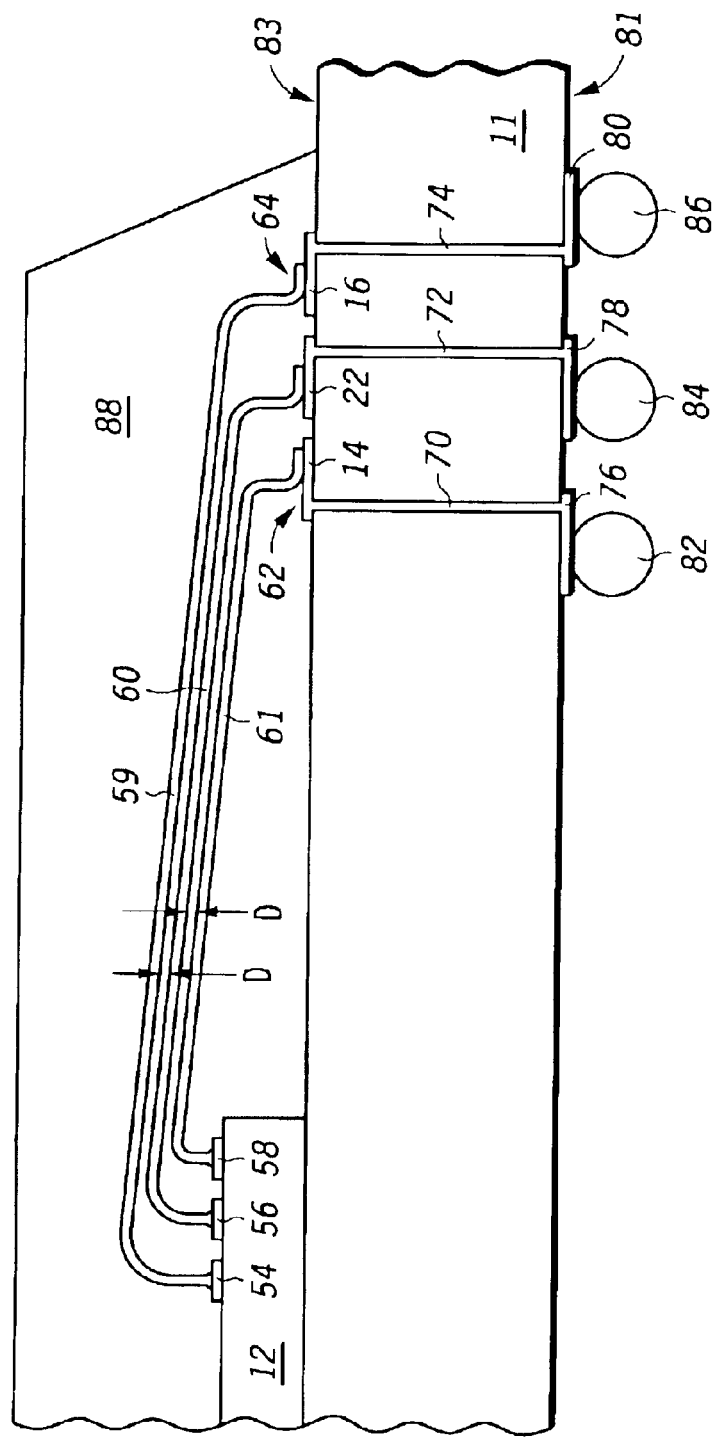
FIG. 2 illustrates a cross-sectional view of the packaged semiconductor device of FIG. 1, in accordance with one embodiment of the present invention.

FIG. 2 illustrates a cross-sectional view of packaged semiconductor device 10 of FIG. 1. In FIG. 2, it can be seen how bonding wires 59–61, within a same wire grouping of three wires, are all in line and spaced by separation distance D along at least 50 percent of the shortest of any two adjacent wires. That is, in the embodiment of FIG. 2, bonding wires 59–61 are all in a plane that is substantially perpendicular to a top surface 83 of package substrate 11. The illustrated embodiment of FIG. 2 also illustrates an encapsulation layer 88 (not shown in FIG. 1) overlying semiconductor device 12, bonding wires 59–61, and the top surface of package substrate 11. Note that encapsulation layer 88 may be of any type of encapsulant known in the art, and is generally an insulating material. Also note that encapsulation layer 88 is optional and may not be present at all. Alternatively, encapsulation layer can simply be air, where the packaged semiconductor device 10 can include walls and a lid to contain package substrate 11, device 12, and bonding wires 59–61, where air fills the empty spaces within the container.

The illustrated embodiment of FIG. 2 illustrates package substrate 11 as having a plurality of interconnects 70, 72, and 74, and a plurality of solder lands 76, 78, and 80 on a bottom surface 81, opposite top surface 83, and a plurality of solder balls 82, 84, and 86 overlying the solder lands. The interconnects 70, 72, and 74 route signals and power between the power buses and bonding pads on top surface 83 through to bottom surface 81 (i.e. to the corresponding solder ball). Therefore, solder balls 82, 84, and 86 provide electrical connections, through package substrate 11 and bonding wires 59–61 to semiconductor device 12. Note that package substrate 11 is illustrated as being a single interconnect layer; however, in alternate embodiments, package substrate 11 may include any number of interconnect layers (i.e. metal layers) having both interlayer interconnects and intralayer interconnects, as known in the art. Therefore, the embodiment of FIG. 2 illustrates one example of the use of closely-spaced wires in a ball grid array (BGA) application. Alternatively, solder balls 82, 84, and 85 may not be present, such as in a land grid array (LGA) application. Also note that in an alternate embodiment, semiconductor device 12 may be in a recessed cavity within package substrate 11. In one embodiment, semiconductor device 12 may be in a recessed cavity such that bond pads 54, 56, and 58 are substantially coplanar with bonding locations 62 and 64 and bond post 22, or may even be lower than bonding locations 62 and 64 and bond post 22.

Figure 3:
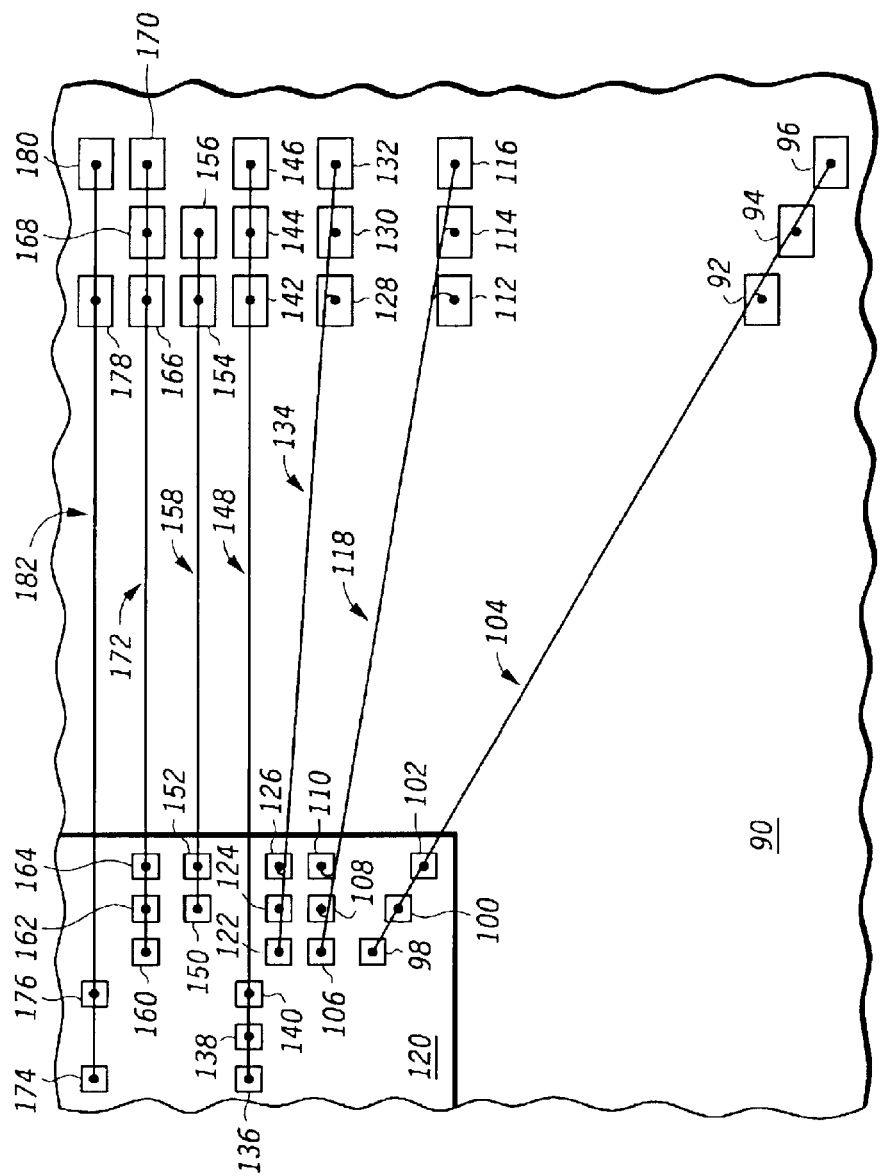
FIG. 3 illustrates a top-down view of a packaged semiconductor device, in accordance with another embodiment of the present invention.

FIG. 3 illustrates a top-down view of one embodiment using closely-spaced wires. FIG. 3 includes a portion of a package substrate 90 and a semiconductor device 120 overlying package substrate 90. As with semiconductor device 12, semiconductor device 120 can be any type of semiconductor device or die or maybe any type of active or passive element. Also, package substrate 90 can be any type of package substrate and may use a variety of different types of packaging technologies. Semiconductor device 120 includes a plurality of bond pads 98, 100, 102, 106, 108, 110, 122, 124, 126, 150, 152, 136, 138, 140, 160, 162, 164, 174, and 176 overlying a top surface of semiconductor device 120. Package substrate includes a plurality of bond posts 92, 94, 96, 112, 114, 116, 128, 130, 132, 142, 144, 146, 154, 156, 166, 168, 170, 178, and 180 overlying a top surface of package substrate 90. Note that in alternate embodiments, some of the bond posts, as needed, may instead be bonding locations on a power bus, such as, for example, a power ring or a segmented power ring. FIG. 3 also includes wire groupings 104, 118, 134, 148, 158, 172, and 182 which electrically couple bond pads to bond posts. Each of the wire groupings have multiple wires (two or more) but appear as one wire for a majority of the length of the wires because they are positioned one above another such that they define a plane that is substantially perpendicular to the top surface of package substrate 90. Also, note that any two adjacent wires within each wire group is at a separation distance D from each other for at least 50 percent of the length of the shorter wire. (Again, in one embodiment, the separation distance D is at most twice the diameter of the wire having the largest diameter of the two adjacent wires.)

FIG. 3 illustrates many examples of possible configurations for different wire groupings. For example, bond pads 98, 100, and 102 are electrically coupled to bond posts 96, 94, and 92, respectively, via wire grouping 104 which includes 3 bonding wires. Note that bond pads 98, 100, and 102 are located on a corner of semiconductor device 120, and unlike the corner pads in FIG. 1, these pads are in a staggered configuration, as are the corresponding bond posts. However, even though the bond pads and posts are staggered, each of the three wires are in line with each other such that from the top-down view of FIG. 3, they appear as a single line. In the illustrated embodiment, each of the wires within wire grouping 104 are in a plane that is substantially perpendicular to the top surface of package substrate 90. Furthermore, although not discernable from the view of FIG. 3, each of the adjacent wires are within a separation distance D from each other for at least 50 percent the length of the shorter wire. If viewed from the side, one would see a first bonding wire connecting bond pad 102 to bond post 92. Then, at a separation distance D above it, for at least 50 percent the length of the first bonding wire, a second bonding wire connecting bond pad 100 to bond post 94. Then, at a separation distance D above it, for at least 50 percent the length of the second bonding wire, a third bonding wire connecting bond pad 98 to bond post 96.

Still referring to FIG. 3, bond pads 106, 108, and 110 are electrically coupled to bond posts 116, 114, and 112, respectively, via wire grouping 118 which includes 3 bonding wires. In this example, each of the bond pads and bond posts are collinear and perpendicular to a line defined by an outer edge of semiconductor device 120. However, note that bond pads 106, 108, and 110 are not collinear with bond posts 112, 114, and 116. Therefore, in one embodiment, they may not be collinear with each other, but the three bonding wires are at least within a separation distance of D of each other, as described above, for at least 50 percent of the length of the shortest wire. Note that the wires may deviate more from each other as they approach the bond posts or bond pads in order to properly connect to them. Bond pads 122, 124, and 126 are electrically coupled to bond posts 132, 130, and 128, respectively, via wire grouping 134 which also includes 3 wires. The same descriptions provided to wire grouping 118 also applies to wire grouping 134.

As illustrated in FIG. 3, semiconductor device 120 may also include bond pads that are not located at a periphery of the device. For example, bond pads 136, 138, and 140 are not located at the periphery, and may, for example, be located in center region of the device. Bond pads 136, 138, and 140 are electrically coupled to bond posts 146, 144, and 142, respectively, via wire grouping 148. Note that wire grouping 148 also includes 3 wires that appear as one wire because the wires, for a majority of the length, are also collinear with each other such that they are all define a plane substantially perpendicular to the top surface of package substrate 90. Also, the wires adhere to the separation distance D spacing described above. The center bond pads may correspond, for example, to power-signal-ground (in any order), to power-ground-power, or to ground-power-ground (such as, for example, to supply core power distribution for semiconductor device 120). The center bond pads may also correspond to a differential signal pair having a ground connection, too. Alternatively, the center bond pads may be part of a center bond pad array for providing electrical connections to a memory.

FIG. 3 also includes bond pads 150 and 152 which are electrically coupled to bond posts 156 and 154, respectively, via wire grouping 158. Note that wire grouping 158 includes only two wires, which may correspond, for example, to a signal-power pair, a signal-ground pair, a power-ground pair, or a differential signal pair. Again, the wires are collinear for a majority of the wire length. Also, note that in one embodiment, as with bond pads 150 and 152 and bond posts 154 and 156, each of the bond pads and the bond posts are collinear themselves and they are collinear with each other such that wire grouping 158 is substantially perpendicular to the outer edge of semiconductor device 120. (Alternatively, a wire grouping having only 2 wires may not lie substantially perpendicular to the outer edge of semiconductor device 120, and the wires my be coupled to pads that may be located away from the periphery of device 120 or that may be staggered with respect to the edge of device 120, similar to wire groupings 104 and 118.) FIG. 3 also includes bond pads 160, 162, and 164 that are electrically coupled to bond posts 170, 168, and 166, respectively, via wire grouping 172, which includes three wires which are all substantially, perpendicular to the outer edge of semiconductor device 120. In one example, the three wires within wire grouping 172 may correspond to power-signal-ground (in any order) or a differential pair with a ground connection.

FIG. 3 also includes bond pads 174 and 176 which are also not located at a periphery of semiconductor device 120. They may, for example, be located in a center portion of semiconductor device 120. In one embodiment, they provide power and ground for the core (not shown) of semiconductor device 120. Alternatively, they may provide center connections to a memory. Alternatively, they may correspond to a differential signal pair. Bond pads 174 and 176 are electrically coupled to bond posts 180 and 178, respectively, via wire grouping 182 which includes only two wires. Note that bond posts 178 and 180 may be more spaced apart from each other since only two bond posts are required. Similarly, note that bond pads 174 and 176 may be more spaced apart from each other since only two bond pads are required.

Therefore, FIG. 3 illustrates a variety of different embodiments for positioning the wire groupings in various ways. Note that in one embodiment, every signal along a periphery or non-periphery portion of semiconductor device 120 may include another connection (such as, for example, a power or ground connection) resulting in wire groupings of two wires extending from each signal location. Alternatively, every signal may include another two connections (such as, for example, a power and a ground connection) resulting in wire groupings of three wires extending from each signal location. As described above, the ability to include these additional power and ground connections allows for improved electrical performance. Also, the use of the closely-spaced bonding wires within the wire groups allows for an increased number of connections and a reduction of loop inductance. Note that the wire groupings of FIG. 3 are all illustrated as collinear and coplanar (as shown in the cross-section of FIG. 2); however, as discussed above, alternate embodiments may use any configuration of wires within a wire grouping so long as the separation distance D is maintained for at least 50 percent of the shortest wire of the two adjacent wires.

As will be seen in reference to FIGS. 4–8 the wire groupings of closely-spaced wires described above and in reference to FIGS. 1–3 may be used in a variety of different packaging applications other than and in addition to BGA and LGA applications. Some example are provided in reference to FIGS. 4–8. Note that the bonding wires illustrated in these figures are closely-spaced wires within wire groupings such that the separation distance D between any two adjacent wires is maintained for at least fifty percent of the length of the shorter of the two adjacent wires (where the separation distance D may be defined as at most twice the diameter of the larger wire). The packaging technologies illustrated in FIGS. 4–8 will not be discussed in a lot of detail herein since, in light of the previous discussions, it should now be apparent to one of ordinary skill in the art how closely-spaced wires as described herein can be used in a variety of different applications. Furthermore, for simplicity, each of FIGS. 4–8 may not include every detail that may actually be found in a package. For example, solder masks and additional layers may not be illustrated, but it is understood that modifications and additions can be made appropriately, while still using closely-spaced bonding wires.

Figure 4:
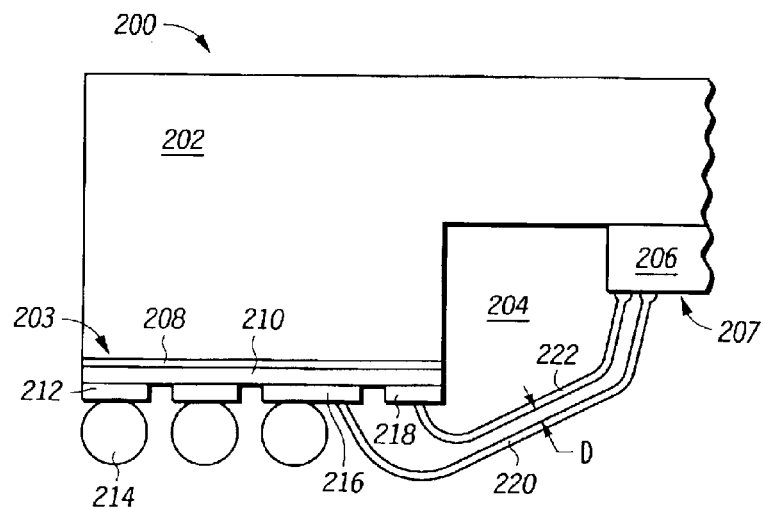
FIGS. 4 and 5 illustrate cross-sectional views of cavity down taped ball grid arrays (TPGAs) packaged semiconductor devices, in accordance with alternate embodiments of the present invention.

FIG. 4 illustrates a portion of a packaged semiconductor device 200, in accordance with an embodiment of the present invention. (That is, note that only an end portion is illustrated.) Packaged semiconductor device 200, in one embodiment, is a cavity down taped ball grid array (TBGA). Packaged semiconductor device 200 includes a heat spreader 202 (such as, for example, a copper heat spreader) having a cavity 204 therein where cavity 204 includes a semiconductor device 206 attached to heat spreader 202. Heat spreader also includes an adhesive insulating layer 208 on a bottom surface 203, surrounding the cavity, and a tape layer 210 overlying layer 208. (Note that as used herein, overlying may be used to refer to layers on either a top or bottom surface, regardless of which side is facing up in the illustration.) Packaged semiconductor device 200 also includes a plurality of conductive pads, such as conductive pad 212, and a plurality of bond posts such as bond post 218 overlying the tape layer 210. Note that in one embodiment, a bond post may be located adjacent to a conductive pad such that both a solder ball and a wire bond may be connected thereto, such as conductive pad and bond post 216. Also note that the conductive pads may be any type of conductive material such as gold, nickel-gold, copper, aluminum, or solder. Note that packaged semiconductor device 200 may also include a plurality of solder balls such as solder ball 214 overlying the conductive pads. In the illustrated embodiment, an exposed (or bottom) surface 207 of device 206 is recessed within cavity 204 as compared to bottom surface 203 of heat spreader 202 which receives the wire bond connections. However, in alternate embodiments, note that bottom surface 207 of device 206 and bottom surface 203 of heat spreader 202 may be substantially coplanar, or bottom surface 207 of device 206 may extend beyond cavity 204.

Bonding wires 222 and 220, within a same wire grouping, provide electrical connections from semiconductor device 206 to bond pad 218 and bond post and bond pad 216. Note that bonding wires 222 and 220 therefore maintain the separation distance D for at least fifty percent the length of bonding wire 222. Also, note that signals between bond post 218 and a corresponding conductive pad and solder ball may be provided by traces overlying tape layer 210 (not shown) as known in the art. Note that in alternate embodiments solder balls may not be present. Also, note that in alternate embodiments, heat spreader 202 may be replaced with a package substrate having a plurality of interconnect layers (where layers 208 and 210 would not longer be present) to route signals from device 206 to conductive pads or solder balls, such as in a cavity down BGA or cavity down LGA application. Note that package substrate or heat spreader 202, layers 208 and 210, conductive pads 212, conductive pad and bond post 216, bond post 218, solder ball 214, and cavity 204 may be formed using conventional processes and materials, as known in the art.

Figure 5:
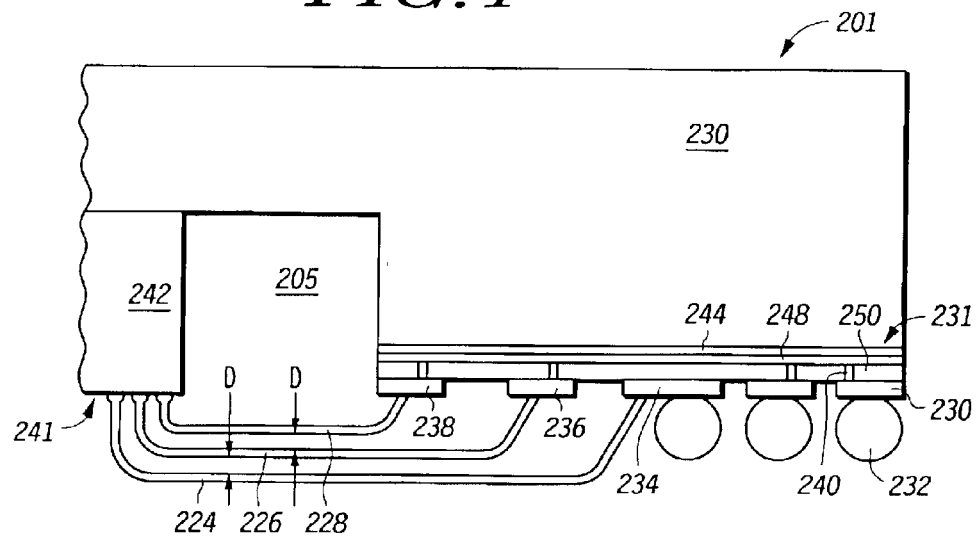

FIG. 5 illustrates a portion of a packaged semiconductor device 201, in accordance with an embodiment of the present invention. (That is, note that only an end portion is illustrated.) Packaged semiconductor device 201, in one embodiment, is another example of a cavity down TBGA. Packaged semiconductor device 201 includes a heat spreader 230 (such as, for example, a copper heat spreader) having a cavity 205 therein where cavity 205 includes a semiconductor device 242 attached to heat spreader 230. Heat spreader 230 also includes an adhesive insulating layer 244 on a bottom surface 231, surrounding cavity 205, and a conductive interconnect layer 248 overlying adhesive insulating layer 244. Packaged semiconductor device 201 also includes a tape layer 250 overlying conductive interconnect layer 248 and a plurality of conductive pads such as conductive pad 230 and a plurality of bond posts such as bond posts 238 and 236 overlying the tape layer 250. Signals may be routed from the conductive pads to the bond posts via interconnect layer 248. That is, tape layer 250 may include a plurality of electrically conductive vias such as electrically conductive via 240 to route signals from the conductive pads to interconnect layer 248 and from interconnect layer 248 to bond posts 238 and 236.

Note that in one embodiment, a bond post may be located adjacent to a conductive pad such that both a solder ball and a wire bond may be connected thereto, such as conductive pad and bond post 234. Also note that the conductive pads may be any type of conductive material such as copper, aluminum, gold, or solder. Note that packaged semiconductor device 201 may also include a plurality of solder balls such as solder ball 232 overlying the conductive pads. Also, in the illustrated embodiment, the exposed (or bottom) surface 241 of device 242 is substantially coplanar with tape layer 250; however, in alternate embodiments, note that the exposed surface 241 of device 242 may be further recessed into cavity 205 or may extend further beyond cavity 205. Bonding wires 224, 226, and 228, within a same wire grouping, provide electrical connections from semiconductor device 242 to bond post and bond pad 234, bond post 236, and bond post 238, respectively. Note that bonding wires 224, 226, and 228 therefore maintain the separation distance D for at least fifty percent the length of the shorter wire of two adjacent wires. Note that in alternate embodiments solder balls may not be present. Note that heat spreader 230, layers 244, 248, and 250, electrically conductive via 240, conductive pad 230, conductive pad and bond post 234, bond post 238, solder ball 232, and cavity 205 may be formed using conventional processes and materials, as known in the art.

Note that in an alternate embodiment of FIG. 5, heat spreader 230 may be replaced with a package substrate having a plurality of interconnect layers, where layers 244, 248, and 250 would no longer be present, to route signals from device 242 to conductive pads or solder balls, such as in a cavity down BGA or cavity down LGA application. In this embodiment, a surface of device 242 may be substantially coplanar with a bottom surface of package substrate 230.

Figure 6:
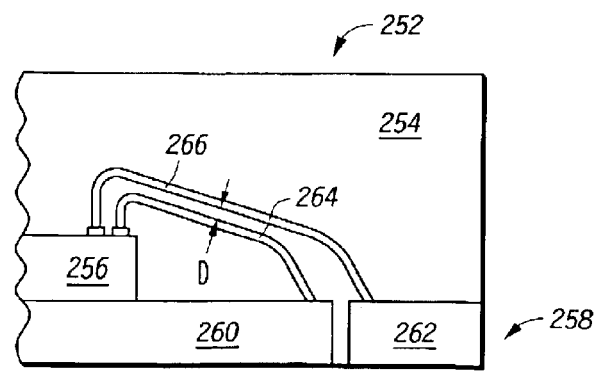
FIG. 6 illustrates a cross-sectional view of a packaged semiconductor device using a lead frame in accordance with one embodiment of the present invention.

FIG. 6 illustrates a portion of a packaged semiconductor device 252 in accordance with an embodiment of the present invention. Packaged semiconductor device 252 illustrates one example of a quad flat no-lead (QFN) package. Packaged semiconductor device 252 includes a semiconductor device 256 overlying a first portion 260 of a lead frame 258. Lead frame 258 also includes a second portion 262 such that in one embodiment, portion 260 corresponds to a ground connection while second portion 262 may correspond to either a signal or VDD power connection. In the illustrated embodiment, bonding wire 264 and 266 are closely-spaced wires (having a separation distance D) within a same wire grouping and provide electrical connections between device 256 and portions 260 and 262 of lead frame 258. Also, a molding compound 254 may be present overlying device 256 and lead frame 258 and between portions 260 and 262 of lead frame 258. Note that lead frame 258 and molding compound 254 may be formed as known in the art using conventional processes and materials. Also, note that packaged semiconductor device 252 may be modified to be a quad flat pack (QFP) or a small outline package (SOP), all which are capable of using closely-spaced wires within wire groupings to achieve improved electrical performance and improved spacing.

Figure 7:
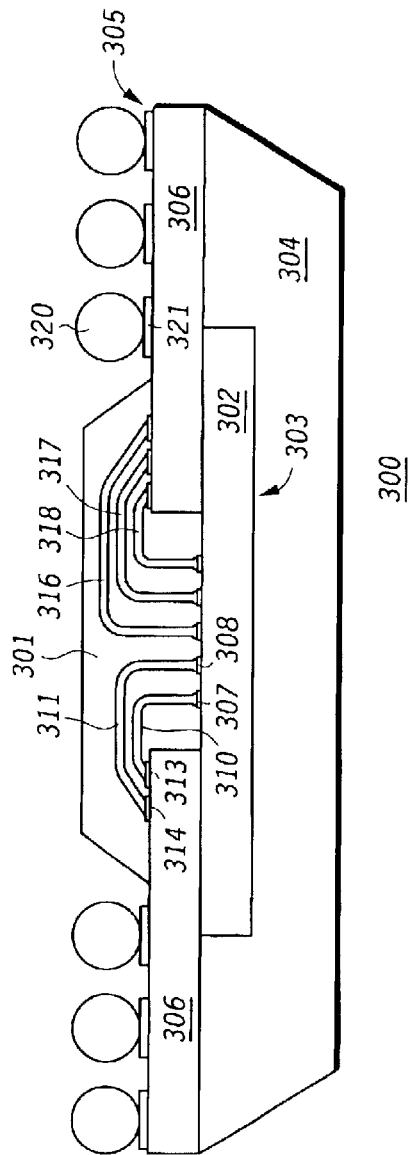
FIG. 7 illustrates a cross-sectional view of a packaged semiconductor device using center bond pads in accordance with one embodiment of the present invention.

FIG. 7 illustrates a packaged semiconductor device 300 in accordance with one embodiment of the present invention which uses center bond pad connections. As discussed above, bond pads may be located within a center portion of a device in addition to or instead of at a periphery of the device. Therefore packaged semiconductor device 300 includes a semiconductor device 302 having an exposed portion with center bond pads such as bond pads 307 and 308. A package substrate 306 overlies the top surface of device 302 and exposes the exposed portion. An encapsulant 304 may be present overlying a bottom surface 303 of device 302 and package substrate 306, as known in the art. Package substrate 306 may also include conductive pads such as conductive pad 321 and a plurality of bond pads such as bond pads 314 and 313 overlying a top surface 305 of package substrate 306. Package substrate 306 may also include solder balls such as solder ball 320 overlying the conductive pads. Bonding wires 311 and 310 are within a first wire grouping of closely-spaced wires and provide electrical connections from bond posts 307 and 308 to bond pads 313 and 314, respectively. Bonding wires 316, 317, and 318 also provide electrical connections from device 302 to package substrate 306 and may be part of a second wire grouping of closely-spaced wires. Package substrate 306 may include one or more interconnect or metal layers to route signals from the bond pads to the solder balls. Packaged semiconductor substrate may also include a second encapsulant 301 overlying the exposed surface portion of device 302, a portion of top surface 305 of package substrate 306, and bonding wires 310, 311, 316, 317, and 318. In one embodiment, device 302 may include a static random access memory (SRAM) or a dynamic random access memory (DRAM) or any other type of memory or other device having center bond pads. Note that package substrate 306, device 302, encapsulants 301 and 304, and solder balls 320 may be formed using conventional processes and materials, as known in the art.

Figure 8:
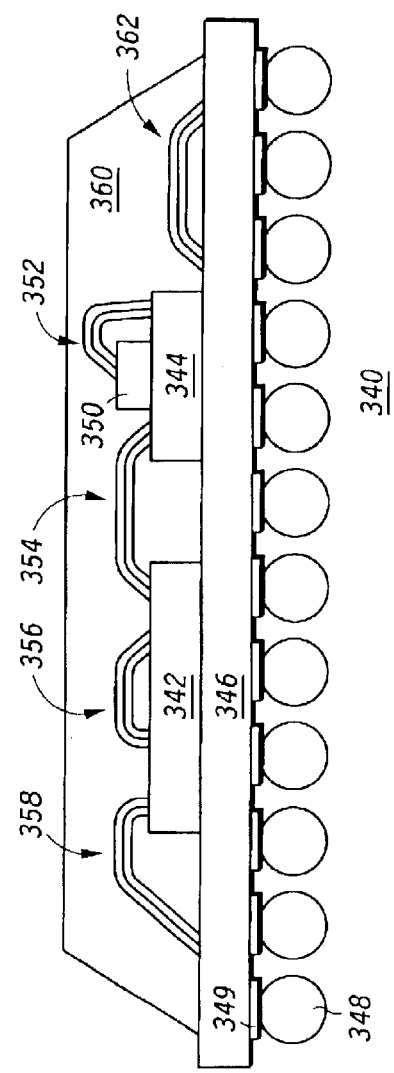
FIG. 8 illustrates a cross-sectional view of a multiple device package in accordance with one embodiment of the present invention.

FIG. 8 illustrates one embodiment of a multi-device package 340. Package 340 includes a package substrate 346 and devices 342, 344, and 350, where devices 342 and 344 overlie package substrate 346, and device 350 overlies device 344. Note that in one embodiment, each of devices 342, 344, and 350 may be a semiconductor device or any other type of active device or may even be a passive device. Therefore, any combination of devices may be located within package 340. Package 340 includes a plurality of wire groupings, each illustrated as having 3 closely-spaced wires (where, in FIG. 8, each wire is illustrated as a single line). Wire grouping 358 provides electrical connections from device 342 to package substrate 346, wire grouping 356 provides electrical connections from one portion of device 342 to another portion of device 342, wire grouping 354 provides electrical connections from device 342 to device 344, wire grouping 352 provides electrical connections between device 350 and device 344, and wire grouping 362 provides electrical connections from a portion of package substrate 346 to another portion of package substrate 346. Note that although not shown, a wire grouping may provide electrical connections between device 350 and package substrate 346. Package 340 may also include an encapsulant 360 encapsulating devices 342, 344, and 350, and wire groupings 358, 356, 354, 352, and 362. Package substrate may also include conductive pads such as conductive pad 349 overlying a bottom surface of package substrate 346 (opposite the surface having devices 342, 344, and 350) and solder balls such as solder ball 348 overlying the conductive pads. Therefore, wire groupings having closely-spaced wires as discussed herein may be used in a variety of ways to provide a variety of different electrical connections, either from device to device, from a device to a package substrate, within a same device, or within a same package substrate. They may also be used for providing electrical connections from an active device such as a die to a passive device, or between stacked devices.

Therefore, it can now be appreciated how the use of closely-spaced wires within a wire grouping can be used in a variety of different applications to achieve improved electrical performance by better controlling impedance and allowing for a reduction in signal-ground, signal-power, and power-ground loop inductance. Furthermore, the cross talk between neighboring signals as well as the simultaneous switching noise associated with a signal bus can also reduced. As described above, the closely-spaced wires within a wiring group are bonding wires having a separation distance D between two adjacent wires along at least 50 percent of the length of the shortest of the two adjacent wires. Each wire grouping can contain wires corresponding to different types of connections, such as to signals, Vdd power, core power, ground, differential signals, etc. Furthermore, the bonding wires and corresponding connection sites (bond pads, bond posts, and bond locations) can be arranged in a variety of different ways while still maintaining the appropriate separation distance D to achieve improvement in electrical performance.

Furthermore, although the above descriptions referred to closely-spaced wires as those wires meeting a separation distance D of at most twice the diameter of the larger wire for at least 50 percent of the length of the shorter wire, alternate embodiments may define closely-spaced wires differently. For example, in one alternate embodiment, the separation distance D for closely-spaced wires is met for at least 60 percent of the length of the shorter of the two adjacent bonding wires, or alternatively, at least 70 or 80 percent of the length of the shorter of the two adjacent bonding wires. In yet another embodiment, two adjacent wires are considered closely-spaced if the separation distance D of at most two times the diameter of the wire having the larger diameter is met for at least 50 percent of a distance between connecting sites (such as connection pads, bond pads, bond posts, etc.) at opposite ends of the two adjacent bonding wires. For example, referring to FIG. 4, bonding wires 220 and 222 may be considered closely-spaced if the separation distance D of at most twice the diameter of the larger of bonding wire 220 and bonding-wire 222 is met for at least 50 percent of the distance between the connecting site of device 206 and conductive pad 218. Alternatively, for this embodiment, the separation distance D for closely-spaced wires is met for at least 60 percent of the distance between the devices, or at least 70 or 80 percent of the distance between the connecting sites.

Note also (as discussed briefly in reference to FIG. 1 above) that the separation distance D may be expressed in terms of a separation pitch instead, such that closely-spaced wires may refer to those wires meeting a separation pitch P (the shortest distance measured between the centers of two adjacent wires, i.e. wire-to-wire pitch) of at most three times the larger diameter for at least 50 percent the length of the shorter wire (or at least 50 percent the distance between the two devices coupled to the ends of the wires). Alternatively, the separation pitch may be met for at least 60, 70, or 80 percent the length of the shorter wire (or at least 60, 70, or 80 percent of the distance between connecting sites). Therefore, these alternate definitions provided for closely-spaced wires may be used within each of the embodiments described above in reference to FIGS. 1–8.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a nonexclusive inclusion, such that a process, method, article, or apparatus that comprises a list of elements does not include only those elements but may include other elements not expressly listed or inherent to such process, method, article, or apparatus.

What is claimed is:

1. A semiconductor package comprising:
   a first device having a surface and a plurality of peripheral edges, the device having a plurality of connection pads positioned on the surface and along an axis that is substantially orthogonal to a predetermined one of the plurality of peripheral edges;

a plurality of wires, each of the plurality of wires having a first end electrically connected to a predetermined one of the plurality of connection pads, each of the plurality of wires having a diameter; and a second device having a surface with a plurality of connection pads, each of which is connected to a second end of a predetermined one of the plurality of wires and substantially along the axis by maintaining a separation distance from an adjacent one of the plurality of wires of no greater than twice a largest diameter of the plurality of wires along at least fifty percent of a length of a shortest wire of the plurality of wires.

2. The semiconductor package of claim 1 wherein the surface of the first device is positioned within a first plane and the surface of the second device is positioned within a second plane that is different from the first plane.

3. The semiconductor package of claim 1 wherein the surface of the first device and the surface of the second device is positioned within a same plane.

4. The semiconductor package of claim 1 further comprising:
    a first connection pad of the plurality of connection pads being adjacent the predetermined one of the plurality of peripheral edges and being a first power bus for conducting a first power signal;
    a second connection pad of the plurality of connection pads adjacent the first connection pad substantially along the axis and toward an internal portion of the first device and being a signal bus for conducting a signal; and
    a third connection pad of the plurality of connection pads being substantially along the axis and adjacent the second connection pad wherein the second connection pad separates the first connection pad and the third connection pad, the third connection pad being a second power bus for conducting a second power signal, wherein positioning the signal between the first power signal and the second power signal achieves a lowered loop inductance for the first power signal, the second power signal and the signal.

5. The semiconductor package of claim 4 further comprising a first wire of the plurality of wires electrically connected to the first connection pad, a second wire of the plurality of wires connected to the second connection pad, and a third wire of the plurality of wires electrically connected to the third connection pad, at least one of the plurality of wires being electrically insulated.

6. The semiconductor package of claim 4 wherein the first power signal is a $V_{DD}$ power supply voltage and the second power signal is a ground reference voltage.

7. The semiconductor package of claim 4 wherein the first power signal is a ground reference voltage and the second power signal is a $V_{DD}$ power supply voltage.

8. The semiconductor package of claim 1 further comprising:
    a first connection pad of the plurality of connection pads being substantially along the axis and adjacent the predetermined one of the plurality of peripheral edges and being a first power bus for conducting a first power signal;
    a second connection pad of the plurality of connection pads being substantially along the axis and adjacent the first connection pad toward an internal portion of the first device and being a second power bus for conducting a second power signal; and
    a third connection pad of the plurality of connection pads being adjacent the second connection pad wherein the second connection pad separates the first connection pad and the third connection pad substantially along the axis, the third connection pad being a signal bus for conducting a signal, whereby positioning the signal adjacent to the first power signal and the second power signal achieves a lowered loop inductance for the first power signal, the second power signal and the signal.

9. The semiconductor package of claim 8 wherein the first power signal is a $V_{DD}$ power supply voltage and the second power signal is a ground reference voltage.

10. The semiconductor package of claim 8 wherein the first power signal is a ground reference voltage and the second power signal is a $V_{DD}$ power supply voltage.

11. The semiconductor package of claim 1 further comprising:
    a first connection pad of the plurality of connection pads being substantially along the axis and adjacent the predetermined one of the plurality of peripheral edges and being a power bus for conducting a power signal; and
    a second connection pad of the plurality of connection pads being substantially along the axis and adjacent the first connection pad toward an internal portion of the first device and being a signal bus for conducting a signal.

12. The semiconductor package of claim 11 wherein the power bus is one of a ground reference voltage bus and a $V_{DD}$ power supply voltage bus.

13. The semiconductor package of claim 1 further comprising:
    a first connection pad of the plurality of connection pads being substantially along the axis and adjacent the predetermined one of the plurality of peripheral edges, the first connection pad being a signal bus for conducting a signal; and
    a second connection pad of the plurality of connection pads being substantially along the axis and adjacent the first connection pad toward an internal portion of the first device, the second connection pad being a power bus for conducting a power signal.

14. The semiconductor package of claim 13 wherein the power bus is one of a ground reference voltage bus and a $V_{DD}$ power supply voltage bus.

15. The semiconductor package of claim 1 further comprising:
    a first connection pad of the plurality of connection pads substantially along the axis and adjacent the predetermined one of the plurality of peripheral edges, the first connection pad being a first power bus for conducting a first power signal; and
    a second connection pad of the plurality of connection pads substantially along the axis and adjacent the first connection pad toward an internal portion of the first device, the second connection pad being a second power bus for conducting a second power signal.

16. The semiconductor package of claim 15 wherein the first power signal is a $V_{DD}$ power supply voltage and the second power signal is a ground reference voltage.

17. The semiconductor package of claim 15 wherein the first power signal is a ground reference voltage and the second power supply voltage is a $V_{DD}$ power supply voltage.

18. The semiconductor package of claim 1 wherein the first device further comprises:
    a second plurality of connection pads located away from the plurality of peripheral edges toward a non-peripheral portion of the first device, the second plurality of connection pads having a first connection pad that is a first power bus and a second connection pad that is a second power bus.

19. The semiconductor package of claim 1 wherein the first device further comprises:
a second plurality of connection pads located away from the plurality of peripheral edges toward a non-peripheral portion of the first device, the second plurality of connection pads having at least three connection pads, each of the three connection pads being either a signal bus or a power bus.

20. The semiconductor package of claim 1 wherein each of the first device and the second device is one of a semiconductor die, a passive element, a package substrate or a lead frame.

21. The semiconductor package of claim 1 wherein the first device further comprises an additional plurality of connection pads positioned on the surface and along a second axis that exits the first device in close proximity to a corner of the first device, each of the additional plurality of connection pads being electrically connected to the second device by a respective conductive wire, all of the additional plurality of connection pads being substantially along the second axis, and each respective conductive wire being separated from an adjacent conductive wire by no greater than twice a largest diameter thereof.

22. The semiconductor package of claim 1 wherein all of the plurality of wires have a substantially same sized wire diameter.

23. The semiconductor package of claim 1 wherein the first device is positioned overlying a portion of the second device to form a stacked semiconductor structure.

24. A semiconductor package comprising:
a first surface formed by a plurality of peripheral edges, the first surface having a first plurality of connection pads positioned along an axis that is substantially perpendicular to a predetermined one of the plurality of peripheral edges;
a plurality of wires, each of the plurality of wires having a wire diameter and a first end electrically connected to a predetermined one of the first plurality of connection pads, any two of the plurality of wires having a wire-to-wire pitch measured at any point along the any two of the plurality of wires; and
a second surface having a second plurality of connection pads positioned thereon, each of which is connected to a second end of a predetermined one of the plurality of wires, the plurality of wires positioned substantially along the axis by maintaining a separation pitch of no greater than three times the wire diameter for at least fifty percent of a length of a shortest wire of the plurality of wires.

25. The semiconductor package of claim 24 wherein the first surface is a surface of a first semiconductor die and the second surface is a surface of a second semiconductor die.

26. The semiconductor package of claim 25 wherein the second semiconductor die is positioned overlying a portion of the first semiconductor die to form a stacked die structure.

27. The semiconductor package of claim 24 wherein the first surface and the second surface are located on a same semiconductor die.

28. A semiconductor package comprising:
a first portion of a surface, the first portion having a plurality of connection pads positioned on the surface and along a predetermined axis;
a plurality of wires, each of the plurality of wires having a first end electrically connected to a predetermined one of the plurality of connection pads, each of the plurality of wires having a diameter; and
a second portion of the surface having a plurality of connection pads each of which is connected to a second end of a predetermined one of the plurality of wires, the plurality of wires positioned substantially along the axis and maintaining a separation distance from an adjacent one of the plurality of wires of no greater than twice a largest diameter of the plurality of wires along at least fifty percent of a length of a shortest wire of the plurality of wires.

29. The semiconductor package of claim 28 wherein the surface is a surface of a packaging substrate.

30. The semiconductor package of claim 28 wherein the diameter of the plurality of wires is a substantially same value for all of the plurality of wires.

* * * * *